(12) United States Patent
Soon et al.

(10) Patent No.: US 6,933,223 B1
(45) Date of Patent: Aug. 23, 2005

(54) ULTRA-LOW LOOP WIRE BONDING

(75) Inventors: Lim Peng Soon, Melaka (MY); Chan Peng Yeen, Melaka (MY)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/826,755

(22) Filed: Apr. 15, 2004

(51) Int. Cl.[7] ............................................. H01L 21/44
(52) U.S. Cl. ...................................................... 438/617
(58) Field of Search ........................................ 438/617

(56) References Cited

U.S. PATENT DOCUMENTS

| | | | |
|---|---|---|---|
| 4,818,895 A | 4/1989 | Kaufman | |
| 5,328,079 A | 7/1994 | Mathew et al. | |
| 5,408,127 A | 4/1995 | Mostafazadeh | |
| 5,463,253 A | 10/1995 | Waki et al. | |
| 5,471,369 A | 11/1995 | Honda et al. | |
| 5,545,922 A | 8/1996 | Golwalkar et al. | |
| 5,735,030 A | 4/1998 | Orcutt | |
| 6,118,184 A | 9/2000 | Ishio et al. | |
| 6,353,265 B1 | 3/2002 | Michii | |
| 6,399,421 B2 | 6/2002 | Han et al. | |
| 6,437,429 B1 | 8/2002 | Wu et al. | |
| 6,467,677 B1 * | 10/2002 | Wildner | 228/180.5 |
| 6,564,115 B1 * | 5/2003 | Kinnaird | 700/121 |
| 2001/0054759 A1 * | 12/2001 | Nishiura | 257/686 |
| 2002/0137327 A1 | 9/2002 | Arakawa | |
| 2003/0042621 A1 * | 3/2003 | Chen et al. | 257/784 |
| 2004/0115918 A1 * | 6/2004 | Kanda et al. | 438/612 |

FOREIGN PATENT DOCUMENTS

| | | |
|---|---|---|
| EP | 0753891 | 1/1997 |
| WO | WO02/08257 | 10/2002 |

OTHER PUBLICATIONS

John Barber, "Plastic Packaging and the Effects of Surface Mount Soldering Techniques," Microchip Technology, Inc., 12 pages, 1995.
Lai et al., Nordic Electronic Packaging Guideline, Chapter A, printed from: http://www.extra.ivf.se/mgl/A-WireBonding/ChapterA.htm, on Mar. 16, 2004, 25 Pages.
Prof. Daniel F. Baldwin, "Fundamentals of IC Assembly," McGraw-Hill, Chapter. 9, pp. 342-353, 2001.
Semiconductor Packaging Assembly Technology, printed from www.national.com, 8 pages, 1999.
Nakanishi et al., "Development of High Density Memory IC Package by Stacking IC Chips," Abstract No. XP000624986, IEEE, vol. Conf. 45, pp. 634-640 (1995).
Patent Abstract of Japan, Pub. No. 63219131, Pub Date Sep. 12, 1988, 2 Pages.

* cited by examiner

*Primary Examiner*—Eddie Lee
*Assistant Examiner*—Douglas W. Owens
(74) *Attorney, Agent, or Firm*—Beyer Weaver & Thomas, LLP

(57) ABSTRACT

A wire bonding technique for manufacturing semiconductor devices that results in a bonded wire having a small loop height. The wire bonding technique involves a capillary tool that ball bonds a wire to a first contact point, then moves upwards, and then towards a second contact point to which the wire will be attached. The capillary tool only moves towards the second contact point in the lateral direction. The height of the wire loop of the bonded wires can be controlled to have desired wire loop heights. The bonding technique can be used in semiconductor devices with stacked dice and in devices where a die and a contact lead are approximately at the same height.

17 Claims, 6 Drawing Sheets

ULTRA-LOW LOOP WIRE BONDING

FIELD OF THE INVENTION

The present invention relates generally to wire bonding techniques, and more specifically to wire bonding techniques that result in wires having low loop heights.

BACKGROUND

Semiconductor packaged devices are continually being designed to be smaller in size. One aspect of manufacturing such devices involves connecting the semiconductor die to the electrically conductive leads to allow the die to communicate with external electrical systems. Typically, electrical wires are connected to these components with a standard stitch bonding (SSB) technique. FIG. 1 illustrates a side plan, diagrammatic view of a semiconductor die 100 that has been connected to a contact lead 102 with a standard stitch bonded wire 104. A capillary 106 is used to bond wire 104 between die 100 and lead 102. Capillary 106 is a hollow tube device through which wire 104 is extruded. Die 100 is shown to be bonded onto a die attach pad 108 with an adhesive material 110. Contact lead 102 is positioned adjacent to die attach pad 108.

FIG. 1 also describes the motion through which a capillary 106 travels in order to bond wire 104 onto die 100 and lead 102. The motion of capillary 106 is described by separating the motion into motion segments A, B, and C. The SSB technique begins with motion segment A where capillary 106 feeds wire 104 out such that an extended length of wire 106 protrudes from capillary 106. Then through various techniques that involve heat and vibration, for example, the extended length of wire 106 is formed into a ball formation. The ball formation, which is at the terminating end of wire 106, is then "ball-bonded" onto a bond pad on die 100. The resulting wire 104 has a squashed ball formation that is attached to die 100, wherein the squashed ball formation is referred to as a ball bond 112.

Then, while feeding wire 104 out of capillary 106, capillary 106 moves through motion segment A by moving upwards from ball-bond 112 and then in a reverse direction relative to lead 102. The motion of capillary 106 in the reverse direction bends wire 104 away from lead 102, which will be the second attachment point of wire 104. Then in motion segment B, capillary 106 again moves in the upward direction and continues to feed wire 104. In motion segment C, capillary 106 moves forward and down until wire 104 is stitch bonded to lead 102. The bend in wire 104 caused by the reverse motion of motion segment A causes wire 104 to have a full arcing shape that arcs upwards between die 100 and lead 102.

The SSB technique used to be a satisfactory technique for bonding wires in semiconductor packaged devices. However, the constraints imposed upon semiconductor device packages today cause SSB to no longer be satisfactory. This is primarily due to the large wire loop height, $H_1$, of wire 104. Height, $H_1$, forces the ultimate thickness of a semiconductor device package to be large since a molding compound is typically required to encapsulate die 100 and the entirety of wire 104.

Attempts to reduce the loop height of a SSB wire involve pulling wire 104 farther downward than normal. In some attempts, wire 104 has been pulled until its loop height, $H_1$, was lower than the heat affected zone (HAZ) of die 100. Unfortunately, the deformed shape of wire 200 caused by the reverse motion of capillary 106 in motion segment A does not hold up well to the stress caused when capillary 106 pulls wire 104 downwards. The reverse motion of motion segment A causes wire 104 to bend towards the right (with respect to FIG. 1), and then the motion of motion segment C causes wire 104 to bend back towards the left. Sometimes bonded wire 104 ends up having the portion of the wire nearest ball bond 112 being deformed and curved to the right and another portion of the wire being deformed and curved back to the left. The resulting wire 104 tends to exhibit necking 114 when force is used to pull wire 104 downwards towards lead 102. Necking 114 occurs in wire 104 near ball-bond 112. Necking 114 refers to fracturing or cracking of wire 104 due to excessive stress imposed upon wire 104. FIG. 2 illustrates a perspective view of two SSB wires 104 that showing signs of necking 114. Necking 114 of wire 104 is exacerbated when wire 104 is pulled further down in attempts to lower loop height, $H_1$.

An alternative technique to lower the loop height of a bonded wire is to reverse the direction of the wire bonding process wherein a wire is first ball bonded onto a contact lead and then stitch bonded onto a semiconductor die. This technique is referred to as reverse stitch bonding (RSB). RSB effectively lowers the loop height because the majority of the wire that forms the loop height rises from the contact lead and along the height of the semiconductor die. Then only a small portion of the loop height actually rises above the die where the wire then continues to extend until it bonds to the die. In other words, a majority of the loop height is hidden within the height of the die.

Although RSB can be effective in reducing the loop height of bonded wires, other problems with RSB reduce the overall desirability of RSB. First of all, long in-bond height consistency is problematic. An in-bond refers to the portion of a wire that extends inwards from the contact lead and over an expanse of a semiconductor die. It is difficult to maintain the desired height consistency of the in-bond portion of bonded wires when using RSB. This is especially difficult when the distance between the first and second bonding points of a wire is large.

A second problem with RSB relates to the formation of a conductive ball on a die bond pad. Such a conductive ball is typically formed on the die bond pad in order to prevent contact and thereby a short circuit between the horizontally oriented segment of the wire that is stitch bonded to the semiconductor die and the die. Contact between the wire and the die is made more possible due to the chances that the size of the conductive ball varies and allows the wires to be positioned closer to the die than is desirable. Contact is also likely because the horizontally oriented region of the wire that is connected to the die may bow downwards onto the die. The conductive ball also represents a manufacturing inefficiency because an extra process step is required to form the ball on the bond pad of the die. Also, an additional stitching motion of the capillary to form the ball is required on top of the motion already required to bond the wire to the lead and the die.

In certain situations, RSB does not provide any advantages. For example, when the top surface of a die and a lead are approximately at the same height or within 3 mils of each other, the RSB does not effectively lower the height of the wire loop. This is because the height of the semiconductor die no longer hides the height of the wire loop. This is especially problematic in Ultra-Thin Packages and Extremely Thin Packages, such as Leadless Leadframe Packages. Also, applications that involve stacked dice tend to involve wires that cross each other. Short circuits are very likely here because the variation of loop heights make it likely that the wires will make contact and short each other out.

In view of the foregoing, there are continuing efforts to provide improved wire bonding techniques to achieve high wire structural integrity and to lower wire loop heights.

BRIEF SUMMARY OF THE INVENTION

The present invention is directed to a wire bonding technique for manufacturing semiconductor devices that results in a bonded wire having a small loop height. The wire bonding technique involves a capillary tool that ball bonds a wire to a first contact point, then moves upwards, and then towards a second contact point to which the wire will be attached. The capillary tool only moves towards the second contact point in the lateral direction. Therefore, the wire is bent down and towards the second contact point such that the resulting wire loop has a very small height.

As a method, one embodiment of the present invention includes at least feeding a wire through a capillary, attaching a first end of the wire onto a first contact point, raising the capillary straight up from the first contact point while the wire continues to feed out of the capillary, moving the capillary towards a second contact point whereby the wire that is fed out of the capillary is drawn towards the second contact point, and attaching the wire to the second contact point wherein a segment of the wire near the first contact point forms a wire loop that has a small loop height.

An alternative embodiment of the invention as a method includes at least feeding a wire through a capillary, attaching a first end of the wire onto a first contact point, raising the capillary up from the first contact point while the wire continues to feed out of the capillary, moving the capillary in a lateral direction that is only towards the second contact point, whereby the wire that is fed out of the capillary is drawn towards the second contact point, and attaching the wire to the second contact point wherein a segment of the wire near the first contact point forms a wire loop that has a small loop height.

As an apparatus, one embodiment of the invention includes at least a semiconductor die, a contact lead positioned proximate to the die, and a wire that is connected between the die and the contact lead wherein a segment of the wire forms a wire loop and wherein the loop height is measured from the first contact point and the wherein the loop height is approximately equal to or smaller than three diameters of the wire.

These and other features and advantages of the present invention will be presented in more detail in the following specification of the invention and the accompanying figures, which illustrate by way of example the principles of the invention.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE INVENTION

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known operations have not been described in detail so not to unnecessarily obscure the present invention.

The present invention pertains to a wire bonding technique for manufacturing semiconductor devices that results in a bonded wire having a small loop height. The small loop height allows the resulting packaged semiconductor device to have a very thin profile. The wire bonding technique involves a capillary tool that ball bonds a wire to a first contact point, then moves upwards, and then towards a second contact point to which the wire will be attached. The lateral motion component of the capillary includes forward motion that is towards the second contact point. The capillary however does not move in a reverse lateral direction that is away from the second contact point. With such capillary movement, the wire is bent down and towards the second contact point such that the resulting wire loop has a very small height. In other words, since the capillary tool does not move away from and then back towards the second contact point, the curvature of the wire loop is minimized.

Figure 1:
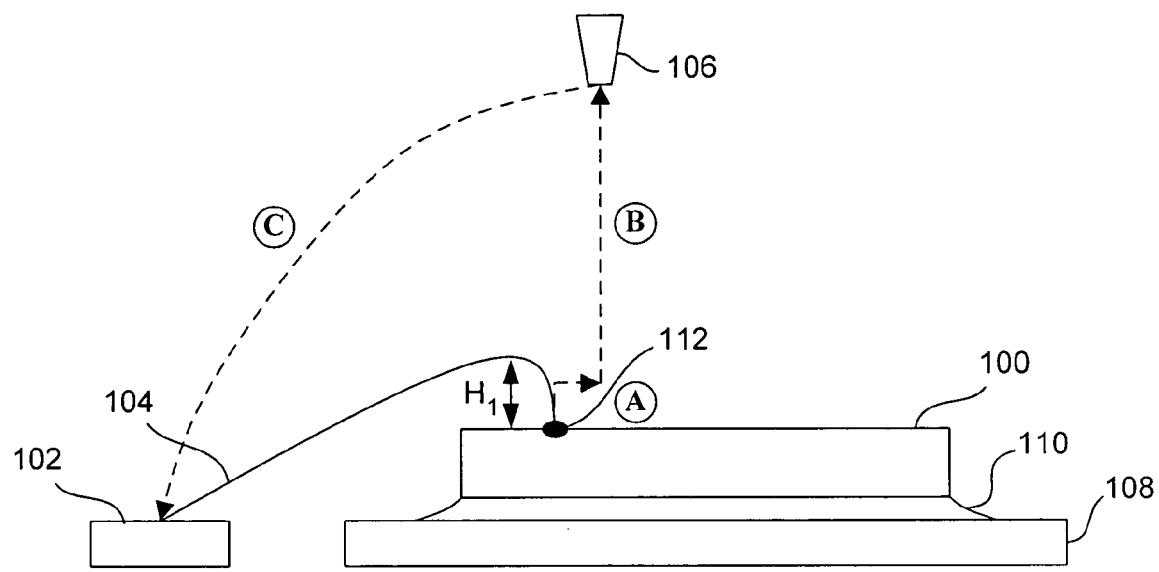
FIG. 1 illustrates a side plan, diagrammatic view of a semiconductor die that has been connected to a contact lead with a standard stitch bonded wire.
Figure 2:
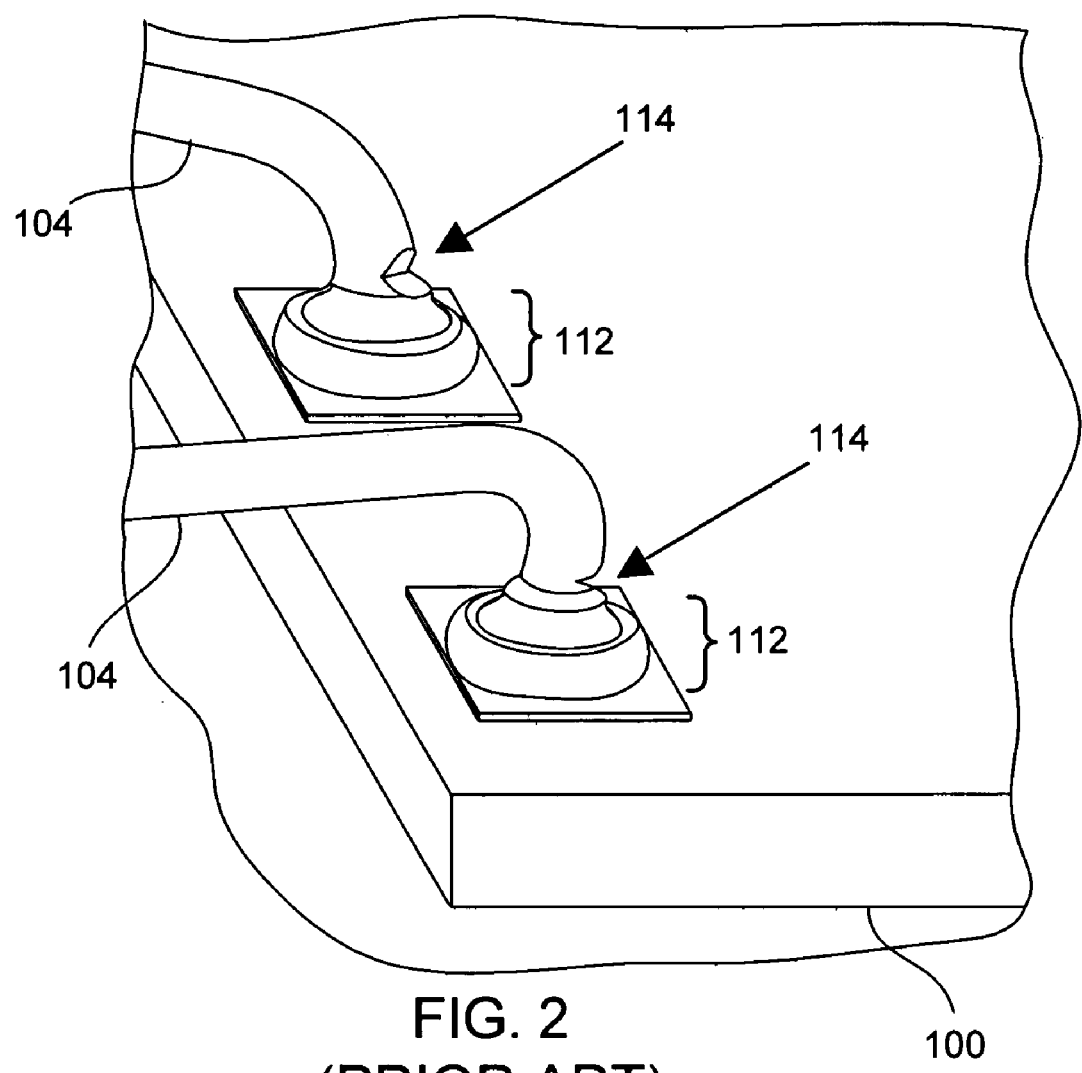
FIG. 2 illustrates a perspective view of two standard stitch bonded wires that show signs of necking.
Figure 3:
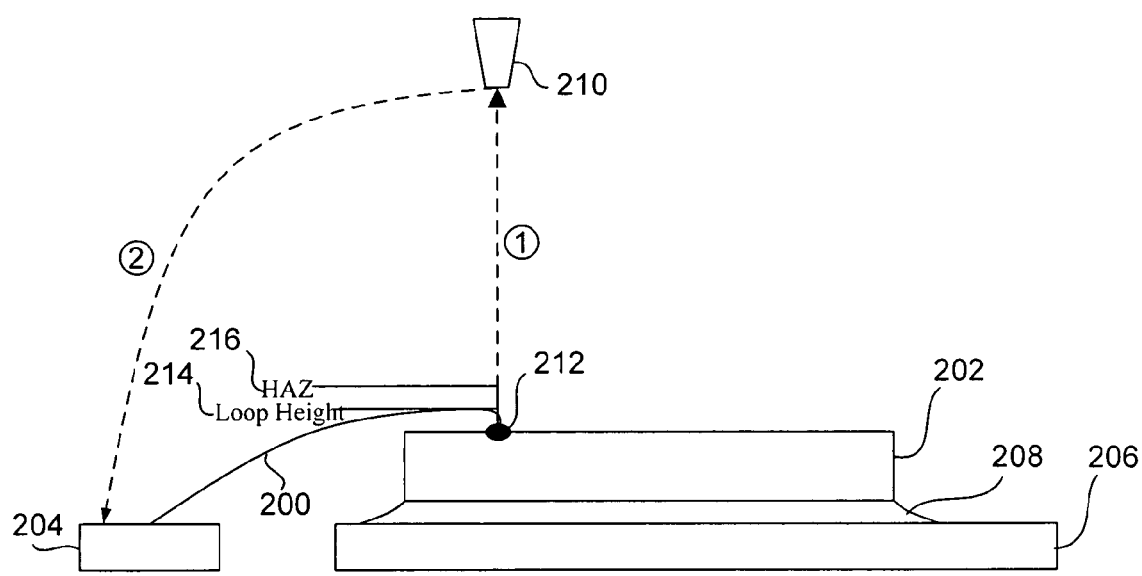
FIG. 3 illustrates a side plan, diagrammatic view of a wire that has been bonded to a semiconductor die and a contact lead with the technique of the present invention.

FIG. 3 illustrates a side plan, diagrammatic view of a wire 200 that has been bonded to a semiconductor die 202 and a contact lead 204 with the technique of the present invention. Semiconductor die 202 is a piece of semiconductor material having integrated circuits and bond pads formed on its top surface. Die 202 is attached to a die attach pad 206 with an adhesive material 208. Contact lead 204 is a conductive piece of material that is positioned proximate to die 202. Contact lead 204, after being connected to die 202 through wire 200, allows die 202 to be connected to external electrical components, such as a printed circuit board. Typically, multiple leads 204 are positioned around die 202 and die attach pad 206. For the purposes of illustrating the present invention in a simple and clear manner, only a single lead 204 is shown in FIG. 3. Capillary 210 is shown in FIG. 3 along with directional, dashed lines 1 and 2, which describe the motion capillary 210 follows in order to bond wire 200 to die 202 and lead 204.

The wire bonding technique of the present invention begins by feeding wire out and through the passageway of capillary 210. Then a ball formation is formed on the end of the wire. The ball formation of the wire 200 is then "ball-bonded" onto semiconductor die 202. Typically, wire 200 is ball-bonded onto a bond pad that is located on the top surface of die 202. The ball formation of wire 200 is bonded to die 202 by being pressed onto die 202 by the bottom surface of the tip of capillary 210. In some embodiments, capillary 210 can be heated and/or vibrated in order to bond the ball formation of wire 200 to die 202. After wire 200 is ball-bonded onto die 202, capillary 210 moves through segment 1 of its movement pattern. Segment 1 takes capillary 210 along a straight upward path that leads away from ball bond 212. Capillary 210 stops rising after a certain length of wire 200 is fed out of capillary 210. In some embodiments, capillary 210 stops rising after enough wire extends out of capillary 210 so that when capillary 210 moves towards contact lead 204, the length of wire 200 can reach lead 204. In other embodiments, wire can be fed through capillary 210 during the entire movement pattern (segments 1 and 2) of capillary 210 until capillary 210 reaches lead 204.

At the top of capillary movement segment 1, capillary 210 begins its motion along movement segment 2. Movement segment 2 moves capillary 210 through its forward and downward motion towards lead 204. Note that capillary 210's forward motion through motion segment 2 makes up capillary's 210 only lateral movement component through movement segments 1 and 2. Note that forward describes lateral motion in the direction from ball bond 212 towards lead 204. Correspondingly, a reverse motion would be movement in the direction from ball bond 212 that would move away from lead 204. In movement segment 1, capillary 210 moves vertically, but it does not move in a forward or reverse lateral direction with respect to ball bond 212. In movement segment 2, capillary 210 moves forward and therefore has substantially no reverse movement in the lateral direction.

During movement segment 2, wire 200 extends out of capillary 210. Therefore, capillary 210 pulls wire 200 down and forward towards lead 204. The first and only lateral direction in which capillary 210 moves is in a forward direction that is towards lead 204. In this way, wire 200 is deformed and caused to curve only towards lead 204 in the region proximate to ball bond 212. With respect to FIG. 3, wire 200 continues to turn in the counter clockwise direction in the region near ball bond 212. Since wire 200 only turns in one direction in the region proximate to ball bond 212, wire 200 is deformed in only one direction and need not endure deformations in any other directions. In mathematical terms, the shape of wire 200 near ball bond 212 does not have an inflection point. An inflection point is a point where the concavity of wire 200 changes. Therefore, less internal stress is imposed upon wire 200 and necking in wire 200 is substantially eliminated when wire 200 is pulled downwards to a very far extent. Motion segments 1 and 2 therefore allow wire 200 to have a very low loop height 214 without necking. Note that loop height 214 is measured in the vertical direction from the top surface of die 202. Also note that wire 200 may have a curved shape that turns in the opposite direction at a region near lead 204.

Figure 4:
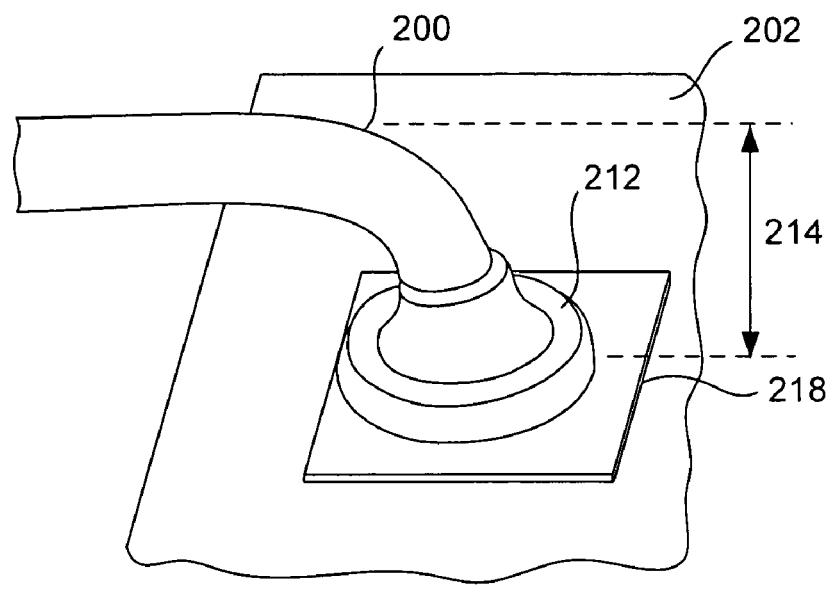
FIG. 4 illustrates a perspective, enlarged picture of wire near ball bond wherein no necking is exhibited by wire.

FIG. 4 illustrates a perspective, enlarged picture of wire 200 near ball bond 212 wherein no necking is exhibited by wire 200. As can be seen wire 200 bends sharply to the left in order to minimize the loop height 214. Ball bond 212 is attached to a bonding pad 218 that is on the top surface of die 202.

When capillary 210 reaches lead 204, wire 200 is typically stitch bonded to lead 204. Stitch bonded means that a portion of wire 200 that bends beneath a bottom surface of capillary 210 is pressed onto lead 204. In other words, wire 200 is pressed onto lead 204 from a sideways direction so that wire 200 is attached to lead 204 at a slanted angle.

As shown in FIG. 3, wire 200 has a loop height 214 that is lower than the height of the heat affected zone 216. For some semiconductor die, the height of heat affected zone 216 is approximately 3–4 mils. In some embodiments, the loop height 214 can be approximately equal to or less than three diameters of wire 200.

The motion of capillary 210 is within a single vertical plane within which capillary 210 moves in vertical directions and a forward lateral direction. This vertical plane falls in line with the contact points of the bond pad of die 202 and lead 204. However, in some embodiments, capillary 210 may move in a sideways lateral direction that would be outside of the vertical plane.

As is commonly understood, the components of FIG. 3 can be molded within a protective molding material, such as plastic or epoxy. Such molding material is injection molded over the components in liquid form and then allowed to cure. The molding material would encapsulate wire 200 while wire 200 would maintain its connection to die 202 and lead 204. Typically, such molding material would leave the bottom surface of lead 204 exposed so that lead 204 could make contact with an electrical contact of a printed circuit board.

The shape of wire 200 can be controlled so that the loop height 214 can be consistently controlled over the process of bonding multiple wires using the technique shown in FIG. 3. The loop height is affected by at least the height to which capillary 210 travels in motion segment 1, the forward lateral distance and the downward vertical distance that capillary 210 travels in motion segment 2, and the material that forms wire 200. By accounting for these various factors, the capillary can be controlled such that a desired shape of bonded wire 200, including loop height 214, can be achieved. This is especially important in typical semiconductor manufacturing processes where a large number of wires are bonded since consistent wire loop heights ensures that none of the wires have loop heights that exceed a design constraint. Control over the shape of wire 200 includes control of the shape of wire 200 near lead 204. Specifically, this includes the height of wire 200 throughout its length until it reaches lead 204. Wire 200 can be any conductive material useful in semiconductor manufacturing processes, such as gold or aluminum.

The motion of capillary 210 of FIG. 3 efficiently creates a bonded wire with low loop height 214 because capillary 210 only requires a sweeping motion in one lateral direction.

Alternative motions can be followed by capillary 210 to bond wire 200 such that a low loop height 214 results. The alternative motions involve pulling wire 200 in directions that cause wire 200 to bend and deform such that it only curves towards lead 204. These motions, therefore, do not involve capillary 210 moving in a reverse direction that is away from lead 204. One specific alternative pattern followed by capillary 210 involves capillary 210 moving diagonally up and in the forward lateral direction (towards lead 204) until capillary 210 is directly above lead 204. Then capillary 210 will move directly down until wire 200 can be stitch bonded to lead 204. Alternatively, capillary 210 can move diagonally up and forward until a point where capillary 210 then moves diagonally down and forward until capillary 210 reaches lead 204.

In other alternative embodiments, wire 200 can be bonded in a reverse order wherein wire 200 is first ball bonded to lead 204 and then stitch bonded to die 202. In this implementation, capillary 210 would only move laterally in the direction towards die 202. In this way, the portion of wire 200 near the ball bond would have only been bent towards die 202 and thereby be less susceptible to necking. This implementation is similar to the technique of reverse stitch bonding discussed earlier, however, this implementation does not involve any lateral movement of capillary 210 that is away from die 202. By controlling capillary 210 so that it does not move in a direction that is away from die 202, wire 200 can be formed to have a lower loop height than what is obtained through conventional reverse stitch bonding techniques. Note that it is still beneficial to form a conductive ball on the bond pad of the semiconductor die so that the wire can be stitch bonded on top of the conductive ball.

In other implementations, wire 200 can be bonded between various components. For instance, wires can be bonded with the inventive technique between two die or between two leads.

Figure 5:
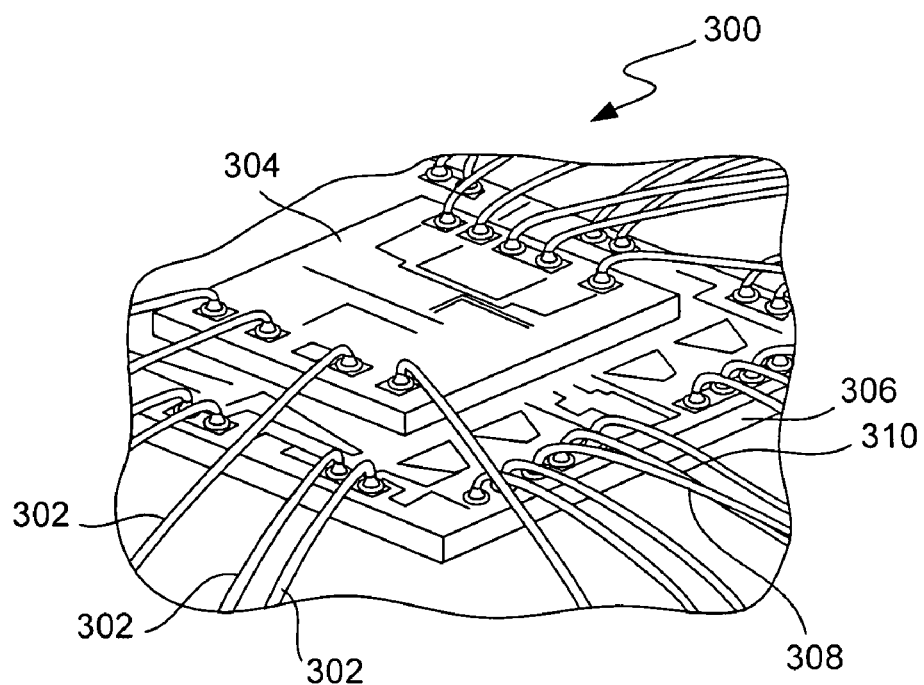
FIG. 5 illustrates a perspective view of a stacked die assembly wherein multiple wires are bonded to each die with the bonding technique of the present invention.

FIG. 5 illustrates one of many semiconductor device configurations in which the wire bonding technique of the present invention can be used. Specifically, FIG. 5 illustrates a perspective view of a stacked die assembly 300 wherein multiple wires 302 are bonded to each die 304 and 306 with the bonding technique of the present invention. Die 304 is attached to the top surface of die 306. Each die 304 and 306 is connected via wires 302 to leads (not shown) that surround the dice. In some embodiments, some of wires 302 can connect die 304 to die 306. Some of wires 302 are bonded to cross over each other. For instance, wires 308 and 310 cross over each other. Wires 308 and 310 cross over each other without coming into contact with each other, otherwise a short circuit would occur. The wire bonding process can be controlled such that the wire loop of one of the crossing wires is shorter than the wire loop of the other wire so that the wires do not touch each other. For instance, the height of motion segment 1 as shown in FIG. 3 can be varied for each of the crossing wires 308 and 310 to control the wire loop height of each wire. Specifically, the height of motion segment 1 for wire 308 can be higher than that of wire 310 so that wire 308 can easily cross over the top of wire 310.

Figure 6:
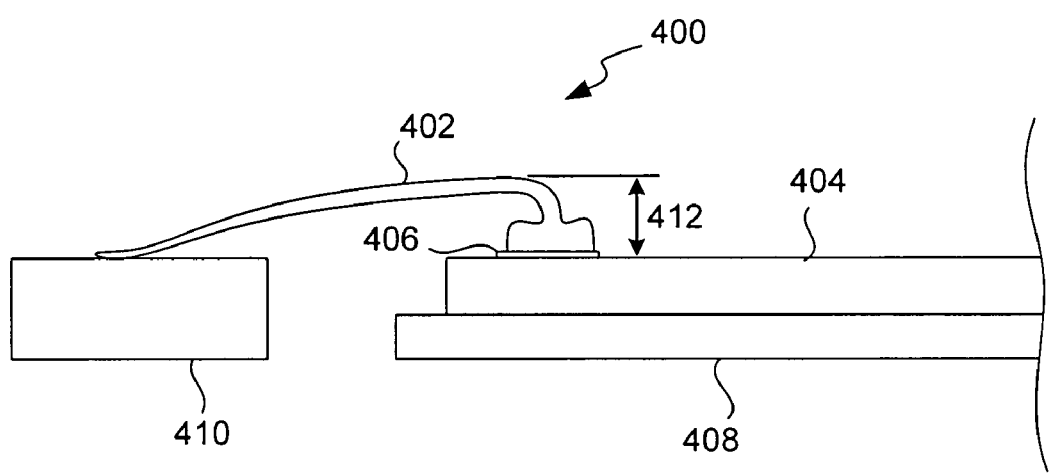
FIG. 6 illustrates a side plan, diagrammatic view of an alternative semiconductor device configuration containing a wire that has been bonded with the technique of the present invention.

FIG. 6 illustrates a side plan, diagrammatic view of an alternative semiconductor device configuration 400 containing a wire 402 that has been bonded with the technique of the present invention. Semiconductor device configuration 400 includes a die 404, a bond pad 406, a die attach pad 408, and a lead 410. Wire 402 is ball bonded onto bond pad 406 that is located on the top surface of die 404. Wire 402 is also stitch bonded onto the top surface of lead 410. The top surfaces of bond pad 406, which is essentially that of die 404, and lead 410 are approximately at the same height. Wire 402 is wire bonded to die 404 and lead 410 using the technique described in FIG. 3 wherein a capillary only moves forward in the lateral direction while bonding wire 402. Again, "forward" refers to moving in the direction from bond pad 406 towards lead 410. Since wire 402 is bent only in one direction, the wire loop height 412 of wire 402 is minimized while the likelihood of necking is reduced. The wire bonding technique is especially important in semiconductor configurations as shown in FIG. 6 since standard stitch bonding and reverse stitch bonding techniques cannot produce semiconductor device packages that have sufficiently low wire loop heights. Semiconductor device configurations such as in extremely thin packages tend to have die and leads that have top surfaces at approximately the same height or within a certain range from each other (e.g., within 3 mils). It is noted that the wire bonding technique can be performed such that wire 402 is bonded to lead 410 first and then to die 404. In this implementation of the invention, the capillary would not move in a lateral direction that would be away from die 404.

While this invention has been described in terms of several preferred embodiments, there are alteration, permutations, and equivalents, which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

Figure 7:
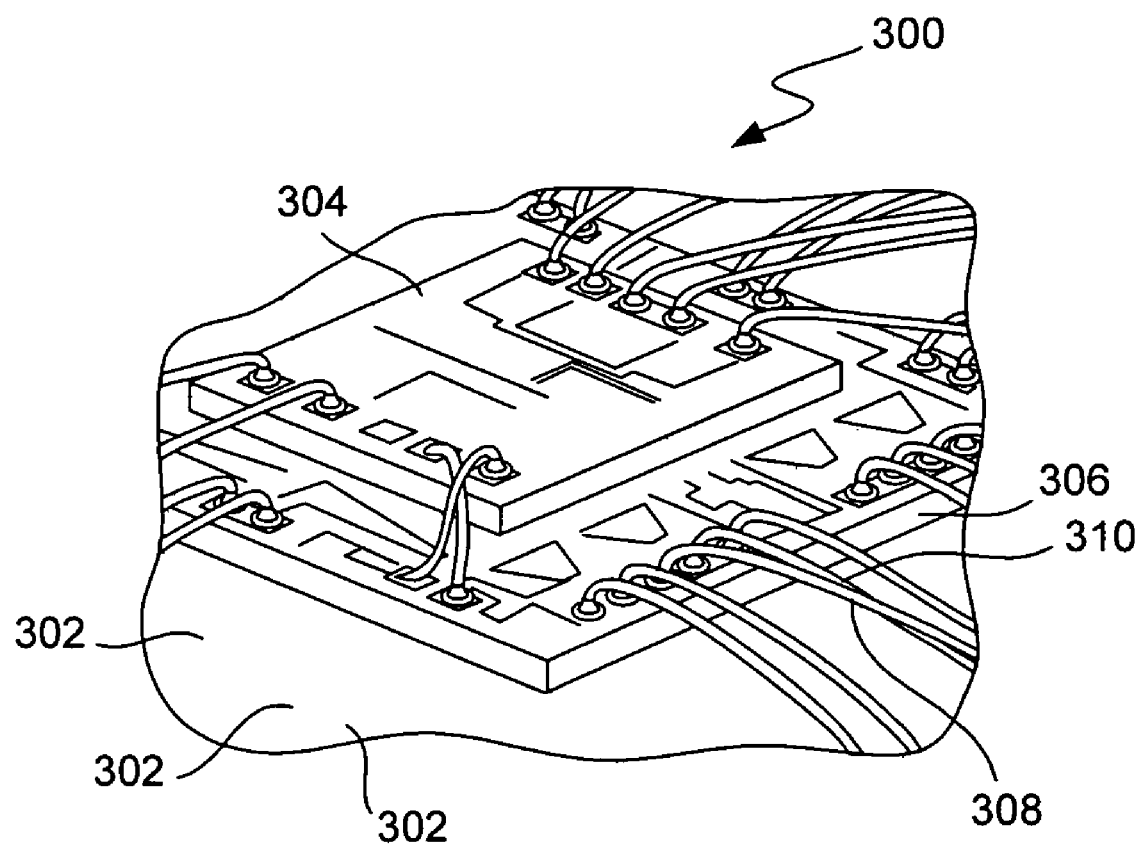
FIG. 7 illustrates a perspective view of a stacked die assembly in accordance with another embodiment of the invention.

FIG. 7 illustrates another stacked die wiring configuration. In this embodiment, bonding wires are used to facilitate die-to-die bonding. When appropriate, some of the die-to-die bonding wires may be crossed and the ball bonds for the die-to-die bonding wires may be formed on either the upper or lower stacked die.

We claim:

1. A method for attaching a wire in a semiconductor device comprising:
   feeding a wire through a capillary;
   attaching a first end of the wire onto a first contact point thereby forming a ball bond;
   raising the capillary straight up from the first contact point while the wire continues to feed out of the capillary;
   directly after raising the capillary straight up, moving the capillary directly to a second contact point whereby the wire that is fed out of the capillary is drawn towards the second contact point; and
   directly after moving the capillary to the second contact point attaching the wire to the second contact point thereby forming a stitch bond wherein a segment of the wire near the first contact point forms a wire loop that has a small loop height, whereby the capillary only moves in a single plane between the attachment of the wire to the first and second contact points and the lateral movement of the capillary is in substantially only one direction such that the only substantial lateral movement of the capillary is towards the second contact point.

2. A method as recited in claim 1 wherein the operation of attaching the first end of the wire comprises ball bonding the wire to the first contact point and wherein the operation of attaching the wire to the second contact point comprises stitch bonding the wire to, the second contact point.

3. A method as recited in claim 2 wherein a segment of the wire that is proximate to the ball bonded portion of the wire has a curvature that only curves towards the second contact point.

4. A method as recited in claim 2 wherein a heat affect zone is a region that extends approximately 3–4 mils above the semiconductor die and wherein the height of the wire loop is smaller than or substantially equal to a height of the heat affected zone.

5. A method as recited in claim 1 wherein the first contact point is a bond pad on a semiconductor die and the second contact point is on a contact lead.

6. A method as recited in claim 1 wherein the first contact point is on a contact lead and the second contact point is a bond pad of a semiconductor die.

7. A method as recited in claim 1 wherein the first contact point is a bond pad of a first semiconductor die and the second contact point is a bond pad of a second semiconductor die, which is stacked on top of the first semiconductor die.

8. A method as recited in claim 1 further comprising:
repeating the steps of claim 1 in order to attach multiple wires between respective contact points such that at least two bonded wires cross each other without touching.

9. A method as recited in claim 8 wherein the capillary rises upwards to a first height while attaching a first wire and to a second height while attaching a second wire such that the second wire crosses the first wire at a height that is higher than that of the first wire.

10. A method as recited in claim 1 further comprising:
controlling the capillary such that the capillary attaches the wire to the second contact point at a height that is within 3 mils of the height of the first contact point.

11. A method for attaching a wire in a semiconductor device comprising:
feeding a wire through a capillary;
attaching a first end of the wire onto a first contact point thereby forming a ball bond;
raising the capillary straight up from the first contact point while the wire continues to feed out of the capillary;
moving the capillary towards a second contact point whereby the wire that is fed out of the capillary is drawn towards the second contact point; and
attaching the wire to the second contact point wherein a segment of the wire near the first contact point forms a wire loop that has a small loop height, and wherein the loop height is measured from the first contact point and the loop height is approximately equal to or smaller than three diameters of the wire.

12. A method as recited in claim 11 further comprising:
repeating the steps of claim 11 in order to attach multiple wires between respective contact points such that each of the wires have approximately the same loop height.

13. A method as recited in claim 11 wherein the wire is ball bonded to the first contact point and stitch bonded to the second contact point.

14. A method as recited in claim 11 further comprising:
repeating the steps of claim 11 in order to attach multiple wires between respective contact points such that at least two bonded wires cross each other without touching.

15. A method as recited in claim 14 wherein the capillary rises upwards to a first height while attaching a first wire and to a second height while attaching a second wire such that the second wire crosses the first wire at a height that is higher than that of the first wire.

16. A method as recited in claim 11 further comprising:
controlling the capillary such that the capillary attaches the wire to the second contact point at a height that is within 3 mils of the height of the first contact point.

17. A method for attaching a wire in a semiconductor device comprising:
feeding a wire through a capillary;
attaching a first end of the wire onto a first contact point;
raising the capillary straight up from the first contact point while the wire continues to feed out of the capillary;
moving the capillary towards a second contact point whereby the wire that is fed out of the capillary is drawn towards the second contact point;
attaching the wire to the second contact point wherein a segment of the wire near the first contact point forms a wire loop that has a small loop height, wherein the first contact point is a bond pad of a first semiconductor die and the second contact point is a bond pad of a second semiconductor die, which is stacked on top of the first semiconductor die and wherein at least two wires are connected between the first and the second semiconductor die and wherein the two wires cross each other without touching each other.

* * * * *